United States Patent [19]
Suzuki et al.

[11] Patent Number: 5,806,583
[45] Date of Patent: Sep. 15, 1998

[54] EASILY MANUFACTURED COOLING APPARATUS USING BOILING AND CONDENSING REFRIGERANT AND METHOD OF MANUFACTURING THE SAME

[75] Inventors: Masahiko Suzuki, Hoi-gun; Kiyoshi Kawaguchi, Toyota; Shigeru Kadota, Hekinan, all of Japan

[73] Assignee: Nippondenso Co. Ltd., Kariya, Japan

[21] Appl. No.: 631,217

[22] Filed: Apr. 12, 1996

[30] Foreign Application Priority Data

Apr. 14, 1995 [JP] Japan ................................. 7-088988
Dec. 20, 1995 [JP] Japan ................................. 7-332145

[51] Int. Cl.⁶ ................................................ F28D 15/00
[52] U.S. Cl. ........................ 165/104.33; 165/104.21; 165/104.14; 257/715; 361/700
[58] Field of Search .................. 165/104.33, 104.21, 165/185, 104.14; 257/715; 361/700

[56] References Cited

U.S. PATENT DOCUMENTS

| | | | |
|---|---|---|---|
| 3,996,604 | 12/1976 | Kimura et al. | 165/104.33 X |
| 4,020,399 | 4/1977 | Suzuki et al. | 165/104.21 X |
| 4,285,027 | 8/1981 | Mori et al. | 165/104.14 X |
| 5,206,791 | 4/1993 | Novotny | 361/700 |
| 5,647,430 | 7/1997 | Tajima . | |

FOREIGN PATENT DOCUMENTS

| | | | |
|---|---|---|---|
| 55-140092 | 11/1980 | Japan . | |
| 59-29986 | 2/1984 | Japan . | |
| 2-3320 | 1/1990 | Japan . | |
| 4-6240 | 2/1992 | Japan . | |
| 4-19338 | 4/1992 | Japan . | |
| 4-267593 | 9/1992 | Japan . | |
| 5211258 | 8/1993 | Japan | 257/715 |
| 8-264692 | 10/1996 | Japan . | |
| 1043430 | 9/1983 | U.S.S.R. | 165/104.14 |

*Primary Examiner*—Denise L. Ferensic
*Assistant Examiner*—Christopher Atkinson
*Attorney, Agent, or Firm*—Cushman Darby & Cushman IP Group of Pillsbury Madison & Sutro LLP

[57] ABSTRACT

Cooling pipes having refrigerant sealed therein are made of flat-shaped pipes having a thin rectangular cross-section, and are disposed to pass through a through hole of a fluid separator. One side of the pipes disposed at a high temperature fluid side of the fluid separator of the cooling pipes serves as a refrigerant portion while the other side of the pipes, disposed at a low temperature fluid side of the fluid separator, serves as a condensing portion. The top and bottom of the cooling pipe communicate with each other via communicating members. In the cooling pipes, a heat receiving fin is connected to the outer wall of the refrigerant portion and a heat radiating fin is connect to the outer wall of the condensing portion. The heat receiving fin and the heat radiating fin are connected integrally with the cooling pipe by brazing.

7 Claims, 9 Drawing Sheets

5,806,583

EASILY MANUFACTURED COOLING APPARATUS USING BOILING AND CONDENSING REFRIGERANT AND METHOD OF MANUFACTURING THE SAME

CROSS-REFERENCE TO RELATED APPLICATIONS

This application is based upon and claims priority of Japanese Patent Application Nos. Hei 7-88988 filed on Apr. 14, 1995 and Hei 7-332145 filed on Dec. 20, 1995, incorporated herein by reference.

BACKGROUND OF THE INVENTION

1. Field of the Invention

The present invention relates to a thermosyphon cooling apparatus using boiling and condensing refrigerant.

2. Description of the Related Art

Conventionally, a heat-generating element such as an electronic part has been used by being contained in a sealed housing. Since the outside air cannot be circulated inside the housing for ventilation in this case, heat exchanging method between the elements inside the housing and the air outside the housing has been used to cool the heat-generating element. A method of using a heat pipe 200 (operating fluid is filled inside) disposed through a housing 100 as shown in FIG. 19 is well-known as a method to guarantee a high heat transfer capacity with few components.

In the heat pipe 200, however, heat resistance is large between the heat pipe 200 and a heat transmission fin 210 fixed to the outer wall of the heat pipe 200 because the heat transmission fin 210 is fixed while the operating fluid fills the inside of the heat pipe 200. Therefore since it cannot be connected by brazing since temperature becomes high during the brazing process, the heat transmission fin 210 is fixed by a mechanical method such as caulking or the like. In this case, compared with connecting the heat transmission fin 210 by brazing (in which heat resistance is small because the fin 210 and the pipe wall are integrally connected), heat resistance becomes large. As a result, the heat transmission fin 210 itself becomes large or the number of the heat pipes 200 used increases, which requires the use of a large-sized body.

SUMMARY OF THE INVENTION

In light of the above-described problem, the present invention has an object of making the size of the cooling apparatus smaller.

According to the present invention, because heat receiving fins and heat radiating fins are connected integrally with a cooling pipe, heat resistance between each fin and the cooling pipe can be small compared with the case where the heat receiving fins and heat radiating fins are mechanically fixed to the cooling pipe. Thus, compared with the case of fixing the heat receiving fins and heat radiating fins mechanically to the cooling pipe, the whole cooling apparatus can be made small.

After connecting the heat receiving fins and the heat radiating fins and deaerating the inside of the cooling pipe, refrigerant can be sealed therein. Therefore the cooling pipe and each fin can be melted together at high temperature for connection.

Since plural cooling pipes communicate with each other via a communicating member, the refrigerant can be sealed in only one sealing operation. That is, each cooling pipe does not have to be deaerated separately to seal the refrigerant but the refrigerant can be sealed into all the cooling pipes at once, which can promote a reduction in the cost compared with the case of sealing the refrigerant into the cooling pipes one by one.

The cooling pipes communicate with each other on one side of each cooling pipe, i.e., in the refrigerant portion via the communicating member. Accordingly, the refrigerant amount per cooling pipe can be leveled via the communicating member (the level of the refrigerant in each cooling pipe becomes substantially the same), which assures constantly stable cooling performance.

Furthermore, the cooling pipe can be formed by meanderingly bending a singular pipe-shaped member several times at both sides of the fluid separator according to required performance. In this case, no matter how many times the cooling pipe meanders at both sides of the fluid separator, the refrigerant can be sealed in one sealing operation without using a communicating member since it is made of a single body.

As described in the above, even if one singular pipe-shaped member is meanderingly bent, the amount of the refrigerant in each refrigerant portion can be evened via a communicating member since the refrigerant portions away from each other at one side of the cooling pipe mutually communicate with each other.

As a practical method of connecting the heat receiving fins, the heat radiating fins and the cooling pipe, brazing is available, where each fin and the cooling pipe can be integrally connected with brazing material, so that heat resistance between them (i.e., between each fin and the cooling pipe) can be smaller.

The level of the refrigerant sealed in the cooling pipe is substantially the same as the fluid separator, which enables construction of a cooling apparatus having high efficiency. In other words, if the refrigerant level is lower than the fluid separator, the condensing portion is formed between the fluid separator and the refrigerant level, which results in a reduced heat transmitting area in real terms at the high temperature fluid side. Conversely, if the refrigerant level is higher than the fluid separator, the heat transmitting area in real terms at the low temperature fluid side decreases. However, if the refrigerant and the fluid separator have substantially the same level, the heat transmitting area at both the high and low temperature fluid sides will not decrease; thus, heat can be efficiently transferred between the refrigerant portion and the condensing portion.

Since one side of the cooling pipe serving as the refrigerant portion is contained in an air-tight space formed with the fluid separator as a wall, high temperature fluid in the air-tight space does not leak outside and the heat of the high temperature fluid in the air-tight space can be transferred to the low temperature fluid. That is, when it is necessary to prevent the fluid from leaking outside, the present invention is suitable as a method for cooling the airtight space.

Since each wall (including the fluid separator) forming the above-described airtight space is made of a magnetic material or conductor, the electromagnetic waves generated by a heat-generating element contained in the air-tight space can be shielded to prevent it from leaking outside.

One side serving as the refrigerant portion is disposed at a tilt in the direction where a gas flow passing area becomes larger with respect to the gas flow direction, so that pressure loss of the gas flow passage can be further reduced.

Since the cooling pipe is air-tightly connected to the fluid separator, the high temperature fluid and the low temperature fluid never mix.

Because the heat receiving fins and the heat radiating fins are connected integrally with the refrigerant portion and the condensing portion, respectively, heat resistance between each fin, the refrigerant portion and the condensing portion can be smaller compared with fixing the heat receiving fins and heat radiating fins mechanically to the refrigerant portion and the condensing portion. Thus, compared with fixing the heat receiving fins and heat radiating fins mechanically to the refrigerant portion and the condensing portion, the whole cooling apparatus can be smaller.

After connecting the heat receiving fins and the heat radiating fins to the refrigerant portion and the condensing portion and deaerating the inside of the refrigerant portion, the condensing portion and the communicating member, the refrigerant is sealed. Therefore the refrigerant portion, the condensing portion, the heat receiving fins and the heat radiating fins can be melted at high temperature for connection.

As a practical method of connecting the refrigerant portion, the condensing portion, the heat receiving fins and the heat radiating fins, brazing is available, where each fin, the refrigerant portion and the condensing portion can be integrally connected with brazing material, so that heat resistance between them (i.e., each fin, the refrigerant portion and the condensing portion) can be small compared with a mechanical connecting method.

Since the refrigerant portion is contained in an air-tight space formed with the fluid separator as a wall, high temperature fluid in the airtight space does not leak outside and the heat of the high temperature fluid in the air-tight space can be transferred to the low temperature fluid. That is, when it is necessary to prevent the fluid from leaking outside, the present invention is suitable as a method of cooling the airtight space.

Since each wall (including the fluid separator) forming the above-described air-tight space is made of a magnetic material or a conductor, electromagnetic waves generated by a heat generating element such as an electronic part contained in the airtight space can be shielded to prevent it from leaking outside.

At least the refrigerant portion can be disposed at a tilt in the direction where a gas flow passing area becomes larger with respect to the gas flow direction, so that pressure loss of the gas flow passage can be further reduced.

Since the connecting pipe is air-tightly connected to the fluid separator, the high temperature fluid and the low temperature fluid never mix.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

A first preferred embodiment of a cooling apparatus using boiling and condensing refrigerant according to the present invention is hereinafter described with reference to the accompanying drawings.

Figure 1:
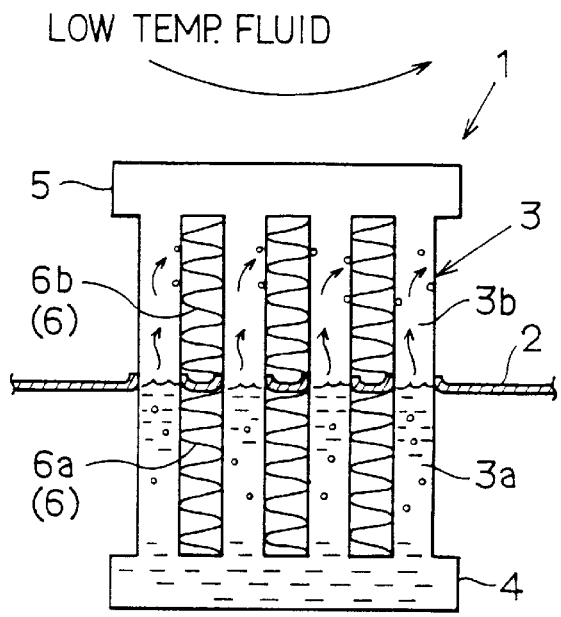
FIG. 1 is a cross-sectional view of a cooling apparatus using boiling and condensing refrigerant according to a first embodiment of the present invention.

FIG. 1 is a cross-sectional view of a cooling apparatus using boiling and condensing refrigerant according to the first embodiment.

A cooling apparatus 1 using boiling and condensing refrigerant of the present embodiment includes a fluid separator 2 to separate high temperature fluid (for example, high temperature air) from low temperature fluid (for example, low temperature air), multiple cooling pipes 3 filled with fluorocarbon refrigerant, a pair of communicating members 4 and 5 communicating with each cooling pipe 3, and heat transmission fins 6 (described later) fixed outside the cooling pipes 3.

Figure 2:
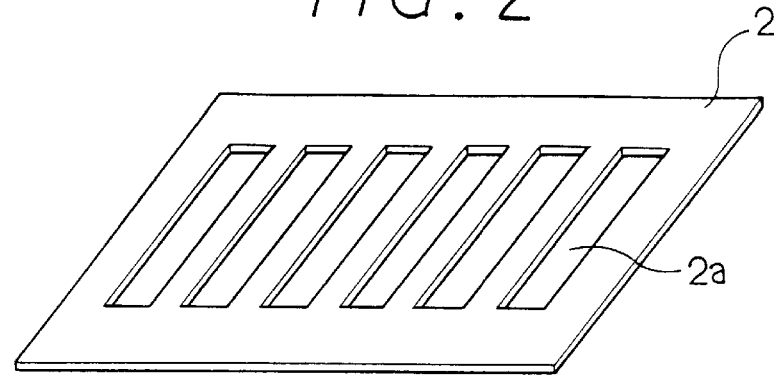
FIG. 2 is a perspective view of a fluid separator in the embodiment.
Figure 3:
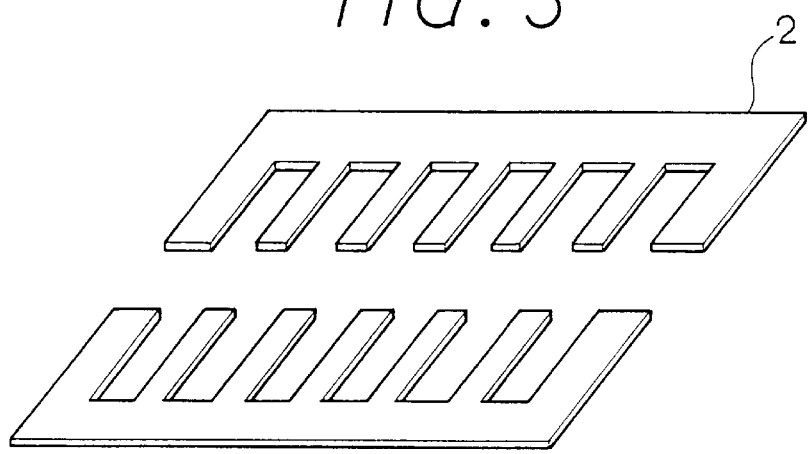
FIG. 3 is another perspective view of the fluid separator according to the embodiment.

The fluid separator 2 is made of a metal such as aluminum and forms a wall of a sealed space, where the inside of the sealed space is at a high temperature, and the fluid separator 2 is also fixed integrally with the cooling pipes 3 (by, for example, brazing). This fluid separator 2, as shown in FIG. 2, has plural thin rectangular-shaped through holes 2a arranged at a fixed interval to allow each cooling pipe 3 to pass therethrough. The fluid separator 2, however, can be divided into two portions as shown in FIG. 3.

The cooling pipes 3 are flat-shaped and are made of metal having high heat transmissibility (such as aluminum or copper) and a thin rectangular (or an oval shaped) cross-section. Each of the pipes pass through a respective one of the through holes 2a of the fluid separator 2. One side of the group of pipes 3 (the lower side in FIG. 1) disposed at the high temperature fluid side above the fluid separator 2 of the cooling pipe 3 serves as a refrigerant portion 3a while the other side disposed at the low temperature fluid side below the fluid separator 2 serves as a condensing portion 3b.

The communicating members 4 and 5 are connected at the top and the bottom of each cooling pipe 3 to communicate with each cooling pipe 3. At least one of the communicating members 4 and 5 has a refrigerant-sealing inlet (not shown) at one place to introduce the refrigerant into the cooling pipes 3 and then seal it therein.

The refrigerant is sealed into each cooling pipe 3 up to substantially the same level as the fluid separator 2. The refrigerant is sealed after brazing the heat transmission fins 6 to the cooling pipes 3.

The heat transmission fins 6 are composed of heat receiving fins 6a disposed between the adjacent cooling pipes 3 at one side (the refrigerant portion 3a side) of the cooling pipes 3 and heat radiating fins 6b disposed between the adjacent cooling pipes 3 at the other side (the condensing portion 3b side) of the cooling pipes 3. The heat transmission fins 6 are corrugated fins made of a thin plate whose thickness is approximately 0.02–0.5 mm of excellent heat transmissible metal (for example, aluminum) formed into a wave shape by bending the metal in alternate directions and are brazed to the flat outer walls of the cooling pipes 3 (that is, the outer walls of the cooling pipes 3 are integrally connected to the heat transmission fins 6).

The operation of the present embodiment is hereinafter explained.

The refrigerant sealed into each cooling pipe 3 boils and is vaporized by receiving the heat transmitted from the high temperature fluid via the heat receiving fins 6a. The refrigerant vapor is condensed and liquified on the inner wall of the condensing portion 3b of each cooling pipe 3 which has a low temperature by being exposed to the low temperature fluid, and the latent heat from the condensed liquid is transmitted to the low temperature fluid via the heat radiating fins 6b. The refrigerant condensed and liquified in the condensing portion 3b drops to the refrigerant portion 3a along the inner wall due to the force of gravity. Heat of the high temperature fluid transfers to the low temperature fluid by the repetition of boiling, condensation and liquefaction without mixing the high temperature fluid with the low temperature fluid.

The effects of the first embodiment are hereinafter described.

Compared with the heat transmission fin 6 connected to the cooling pipe 3 by a mechanical method such as caulking, the present embodiment can reduce heat resistance between the cooling pipe 3 and the heat transmission fin 6 since the heat transmission fin 6 is brazed to the outer wall of the cooling pipe 3. Thus, heat is efficiently transferred from the high temperature fluid to the low temperature fluid, so that the unit as a whole can be smaller in comparison with a conventional unit employing a heat pipe having the same heat radiating performance (i.e., the same cooling performance).

Since the level of the refrigerant sealed into each cooling pipe 3 is substantially the same level as the fluid separator 2, the cooling apparatus using boiling and condensing refrigerant can have high efficiency. In other words, if the refrigerant level is lower than the fluid separator 2, the condensing portion 3b is formed between the fluid separator 2 and the refrigerant level, which causes reduced heat transmitting area in real terms at the high temperature fluid side. On the other hand, if the refrigerant level is higher than the fluid separator 2, the heat transmitting area in real terms at the low temperature fluid side decreases. However, if the refrigerant and the fluid separator 2 have substantially the same level, the heat transmitting area at both the high and low temperature fluid sides will not decrease; thus, heat can be efficiently transferred between the refrigerant portion 3a and the condensing portion 3b.

Since the cooling pipes 3 communicate with each other via the communicating members 4 and 5 in the cooling apparatus using boiling and condensing refrigerant according to the present embodiment, after deaerating the inside of each cooling pipe 3 through the refrigerant-sealing inlet disposed at one of the communicating members 4 and 5, the refrigerant can be sealed into all the cooling pipes 3 from the refrigerant-sealing inlet in only one refrigerant-sealing operation. That is, plural refrigerant-sealing inlets are not required. The cooling pipes 3 do not have to be separately deaerated and sealed with the refrigerant one by one; thus, the cost of manufacturing the assembly can be lowered.

Since the cooling pipes 3 communicate with each other via the communicating members 4 and 5 (especially via the lower communicating member 4), the level of the refrigerant in each cooling pipe 3 can be kept substantially the same, which results in stable cooling performance.

A second preferred embodiment of the present invention is hereinafter described with reference to the accompanying drawings.

Figure 4:
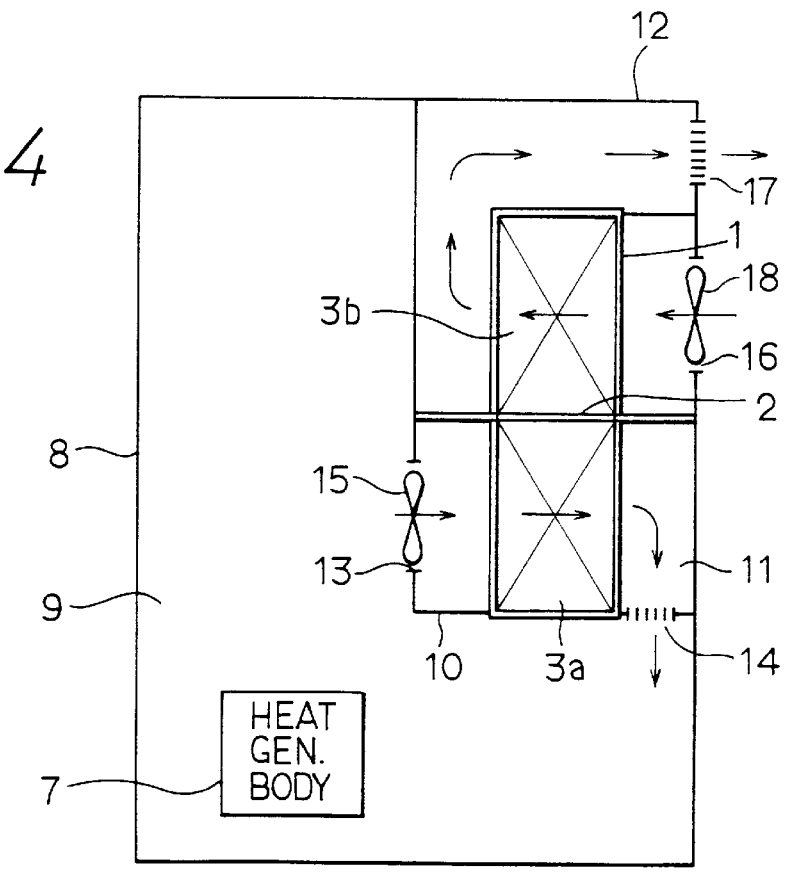
FIG. 4 is a schematic view showing an example where a cooling apparatus using boiling and condensing refrigerant is used according to a second embodiment of the present invention.

FIG. 4 is a schematic view showing an example where the cooling apparatus using boiling and condensing refrigerant is used in a cooling system.

The cooling apparatus using boiling and condensing refrigerant of the present embodiment can be employed especially when a heat generating element has to be contained in a sealed space, which means that the heat generating element is used under a severe environment including, for example, oil, water, iron powder, corrosive gas and the like or when an inert gas (e.g., helium, argon, or the like) is used for prevention of arc discharges at the time of interruption of electricity as well as prevention of oxidation of contact points or when toxic gas (for example, hydrogen fluoride decomposed and produced by fluorocarbons) should not be leaked to the outside.

The cooling apparatus using boiling and condensing refrigerant has the same construction as in the first embodiment; therefore, explanation thereof is omitted in the interest of brevity. The fluid separator 2 forms a wall for a sealed space 9 inside a box 8 containing a heat generating element 7.

The box 8 has the sealed space 9 air-tightly divided by a dividing plate 10 and the fluid separator 2 of the cooling apparatus using boiling and condensing refrigerant therein, a heat transmission space 11 at the high temperature side of the sealed space 9 divided by the dividing plate 10, and also a heat transmission space 12 at the low temperature side separated air-tightly from the heat transmission space 11 by the fluid separator 2.

The heat transmission space 11 communicates with the sealed space 9 through two ventilation ports 13 and 14 on the dividing plate. A fan 15 to circulate the high temperature fluid between the sealed space 9 and the heat transmission space 11 via the two ventilation ports 13 and 14 is disposed at the ventilation port 13. Although the heat transmission space 11 is a part of the sealed space 9, when the sealed space 9 is hereinafter referred to, it represents that part of the sealed space except for the heat transmission space 11.

The heat transmission space 12 communicates with the outside of the box 8 through two ventilation ports 16 and 17 on the side wall of the box 8. A fan 18 is disposed to circulate the low temperature fluid between the outside of the box 8 and the heat transmission space 12 via the two ventilation ports 16 and 17 at the ventilation port 16.

The heat generating element 7 is, for example, a high frequency switching circuit which radiates a large amount of heat as a result of its switching operation and is contained in the sealed space 9 inside the box 8.

As for the cooling apparatus using boiling and condensing refrigerant, the refrigerant portion 3a of the cooling pipe 3 is disposed at one side of the fluid separator 2, namely, in the heat transmission space 11, while the condensing portion 3b of the cooling pipe 3 is disposed on the other side of the fluid separator 2, namely, in the heat transmission space 12.

The operation of the present embodiment is hereinafter explained.

The heat transmission space 11 formed inside the box 8 has a high temperature because high temperature air heated by heat generated by the heat generating element 7 flows therein due to the operation of the fan 15. On the other hand, the heat transmission space 12 has a low temperature in comparison with the heat transmission space 11 because the outside air circulates due to the operation of the fan 18. The refrigerant sealed in the refrigerant portion 3a of each cooling pipe 3 boils and evaporates by receiving heat transmitted via the heat receiving fins 6a from the high temperature air in the heat transmission space 11. The evaporated refrigerant is condensed and liquified on the inner wall in the condensing portion 3b of each cooling pipe 3, and condensed latent heat is transmitted to the air flowing in the heat transmission space 12 via the heat radiating fins 6b. The condensed and liquified refrigerant in the condensing portion 3b drops to the refrigerant portion 3a along the inner wall by self-weight.

By the repetition of boiling, condensation, and liquefaction of the refrigerant, heat generated by the heat generating element 7 can be radiated to the outside of the box 8 while maintaining air-tightness inside the box 8 (i.e., the sealed space 9 and the heat transmission space 11). Thus, heat generating element 7 can be used by being contained inside the sealed box 8, without exposing it to a severe environment. In addition, even if the box 8 is filled with toxic gas, the toxic gas can be prevented from leaking outside.

Figure 5:
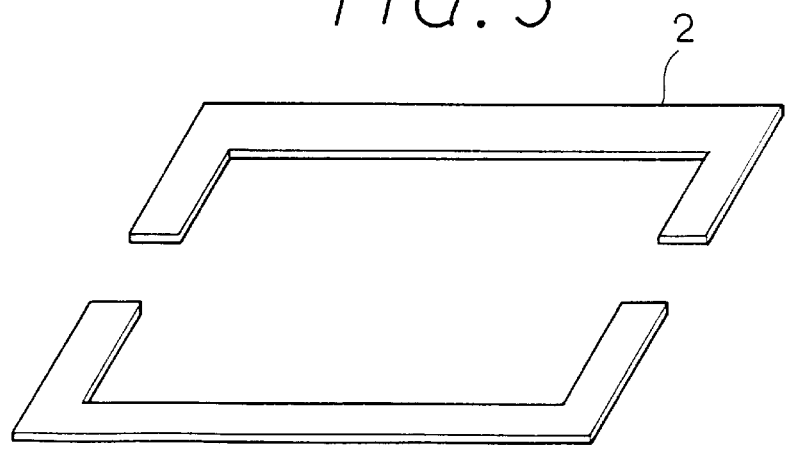
FIG. 5 is a perspective view of a fluid separator in the second embodiment.

Since the box 8 containing the sealed space 9, the heat transmission space 11 and the fluid separator 2 are made of metal, they can act as a shield so that electromagnetic waves generated by the heat generating element 7 (i.e., the high frequency switching circuit) can be contained inside the box 8 to prevent them from leaking to the outside, so that the waves do not interfere with peripheral equipment. Electromagnetic waves from the outside can be also prevented from coming inside the box 8. Furthermore, the fluid separator 2 can be ring-shaped as shown in FIG. 5 (although FIG. 5 shows a fluid separator divided into two parts, they can be integrally formed). That is, the adjacent cooling pipes 3 do not have to be divided by the fluid separator 2, but the electromagnetic wave shield function can be performed by utilizing the heat transmission fins 6.

A third preferred embodiment of the present invention is explained below.

Figure 6:
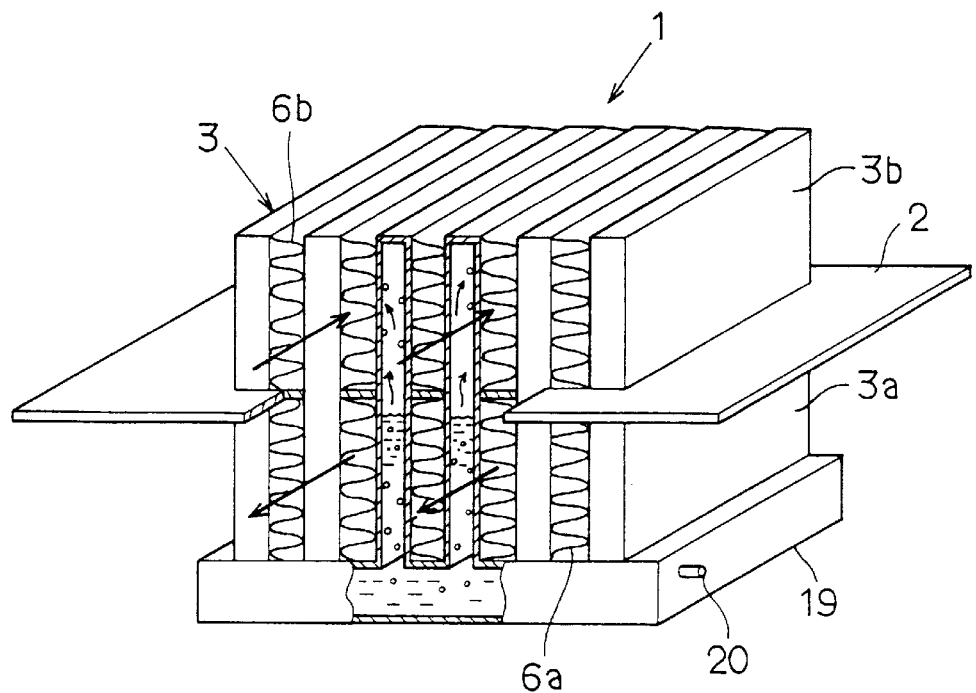
FIG. 6 is a perspective view of a cooling apparatus using boiling and condensing refrigerant according to a third embodiment of the present invention.

FIG. 6 is a perspective view of cooling apparatus using boiling and condensing refrigerant, where only the lower parts of the cooling pipes 3 communicate with each other via a communicating member 19. In this structure, the refrigerant can be sealed within the communicating member 19 using a refrigerant-sealing inlet 19 disposed on the communicating member 19 by only one sealing operation (i.e., only one refrigerant-sealing inlet need be disposed). In addition, since the refrigerant portions 3a of cooling pipes 3 communicate with each other via the communicating member 19, the level of each refrigerant portion 3a can be maintained at the same level, which ensures stable heat radiating performance.

A fourth preferred embodiment of the present invention is described below.

Figure 7:
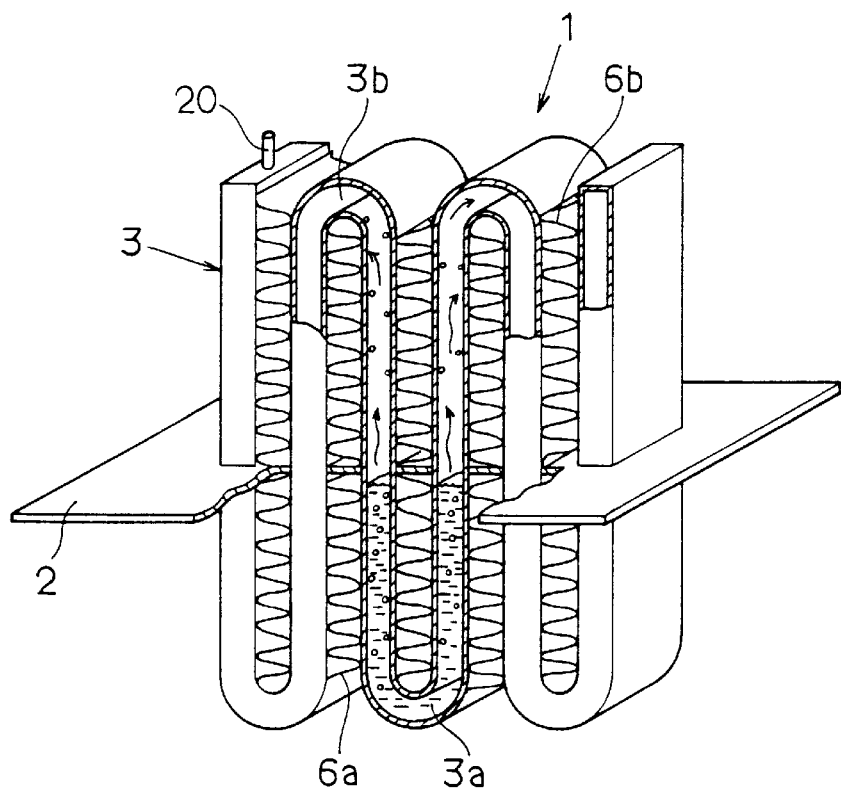
FIG. 7 is a perspective view of a cooling apparatus using boiling and condensing refrigerant according to a fourth embodiment of the present invention.
Figure 8:
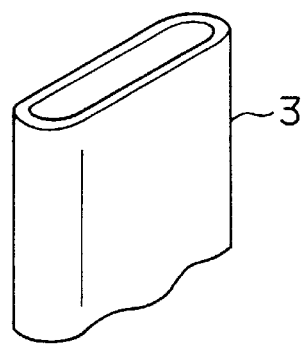
FIG. 8 is a perspective view showing a cross-sectional shape of a cooling pipe according to the fourth embodiment.

FIG. 7 is a perspective view of cooling apparatus using boiling and condensing refrigerant, where one cooling pipe 3 with closed ends meanders along both sides of the fluid separator 2. A refrigerant-sealing inlet 20 is disposed at one end of the cooling pipe 3 to seal the refrigerant therein. According to this structure, only one refrigerant-sealing inlet 20 need be provided no matter how many times the cooling pipe 3 meanders along sides of the fluid separator 2, since the cooling pipe 3 is a single internally-connected body. The cross-sectional shape of the cooling pipe 3 does not have to be rectangular but may instead be oval as shown in FIG. 8.

A fifth preferred embodiment according to the present invention is described below.

Figure 9:
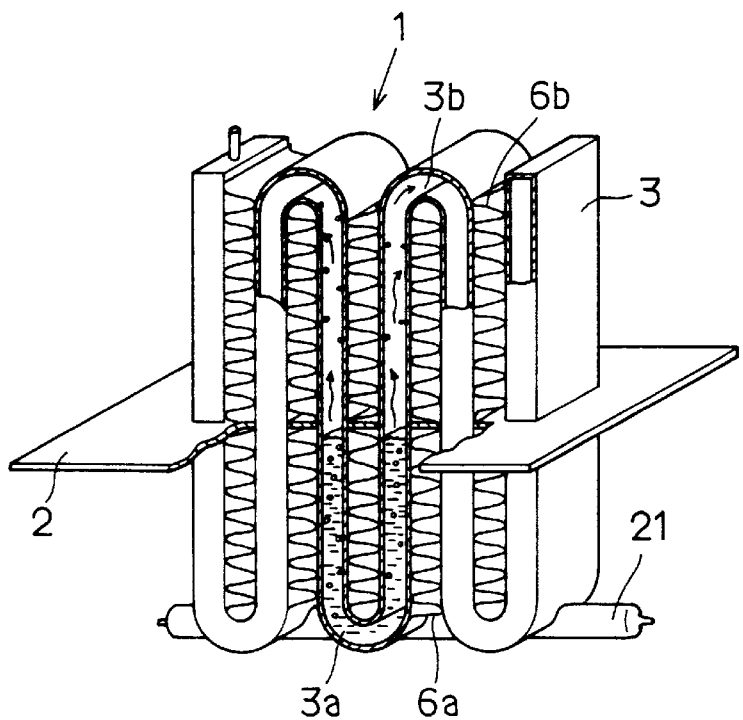
FIG. 9 is a perspective view of a cooling apparatus using boiling and condensing refrigerant according to a fifth embodiment of the present invention.
Figure 10:
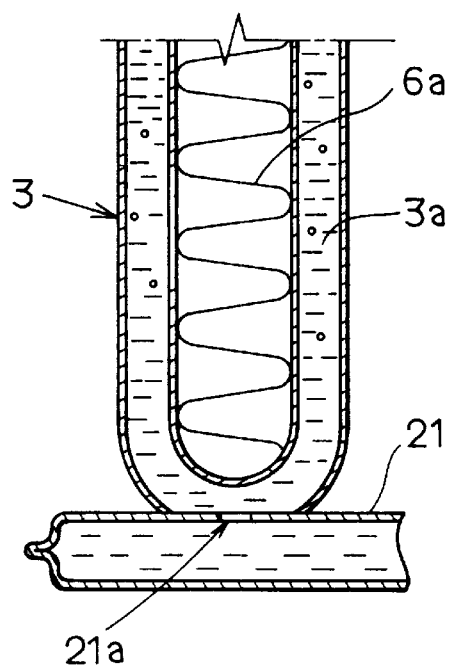
FIG. 10 is a cross-sectional view showing a connection portion between a cooling pipe and a communicating member according to a fifth embodiment of the present invention.

FIG. 9 is a perspective view of the cooling apparatus using boiling and condensing refrigerant, which includes a communicating pipe 21 connected to the lower part of the refrigerant portion 3a in addition to the other structure shown in FIG. 7. The cooling pipe 3 and the communicating pipe 21 are connected air-tightly by brazing as shown in FIG. 10 and communicate with each other through communicating holes 21a in the communicating pipe 21 and cooling pipe 3. According to this structure, since the refrigerant portions 3a communicate with the communicating pipe 21, the level of each refrigerant portion 3a can be maintained at the same level, which ensures stable heat radiating performance.

A sixth preferred embodiment of the present invention is described below.

Figure 11:
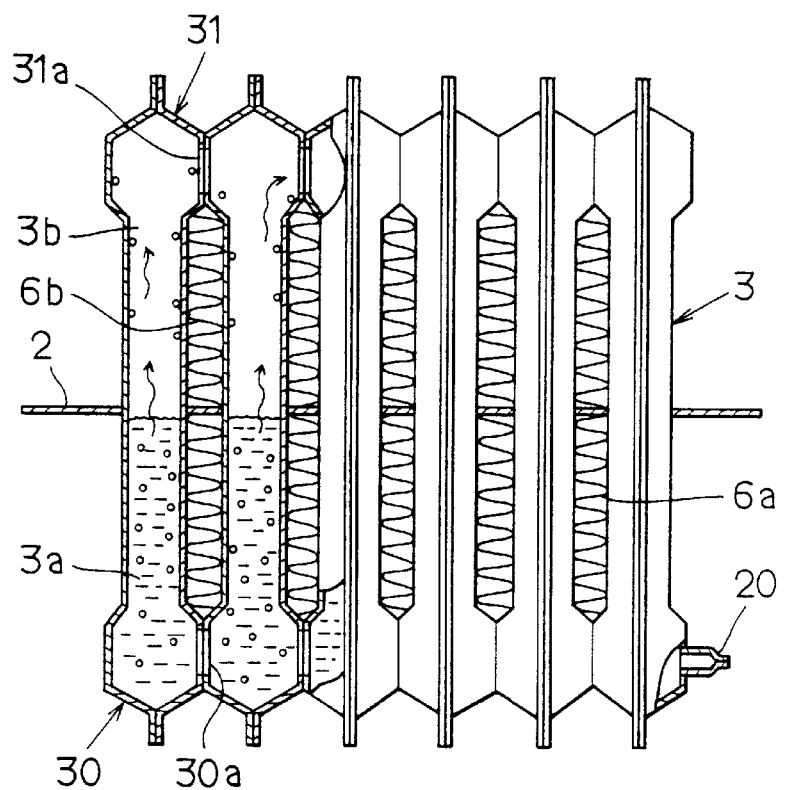
FIG. 11 is a cross-sectional view of a cooling apparatus using boiling and condensing refrigerant according to a sixth embodiment of the present invention.

FIG. 11 is a cross-sectional view of the cooling apparatus using boiling and condensing refrigerant, where tanks 30 and 31 are disposed integrally with opposite ends of cooling pipe 3 to connect the tank portions 30 and 31 of adjacent cooling pipes 3 air-tightly with each other. The walls of the adjacent tank portions 30 and 31 have communicating holes 30a and 31a to communicate with the tank portions 30 and 31. In this structure, the number of parts can be reduced because a communicating pipe does not have to be separately provided.

A seventh preferred embodiment of the present invention is described below.

Figure 12:
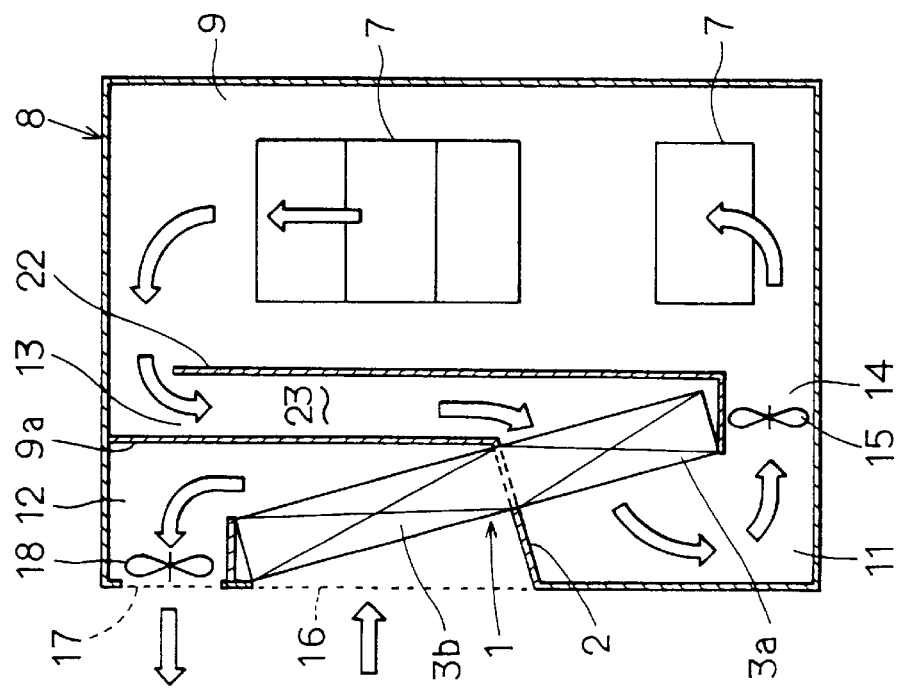
FIG. 12 is a schematic view showing an example where a cooling apparatus using boiling and condensing refrigerant is used according to a seventh embodiment according to the present invention.

FIG. 12 is a schematic view showing an example where the heat generating element 7 is contained in the sealed space 9 similarly to the second embodiment and is characterized in that the ventilation port 13 to take in the gas in the sealed space 9 to the heat transmission space 11 at the high temperature side is disposed above the fluid separator 2. More specifically, a gas flow passage 23 extending vertically inside the sealed space 9 is formed by a side wall 9a defining one side of the sealed space 9 and a dividing wall 22 disposed inside the sealed space 9. The top of the gas flow passage 23 opens to the upper part (i.e., above the fluid separator 2) of the sealed space 9 as the ventilation port 13.

Because high temperature gas heated by the heat generating element 7 can be lead from the ventilation port 13 to the gas flow passage 23 and the refrigerant portion 3a smoothly in this structure, an even temperature inside the sealed space 9 can be maintained. Because the gas which has a high temperature due to the heat generated by the heat generating element 7 rises inside the sealed space 9 by convection, cooling performance inside the sealed space 9 can be improved when the ventilation port 13 is disposed at the upper part of the sealed space 9. In other words, if the ventilation port 13 is disposed lower than the fluid separator 2, gas with a relatively low temperature inside the sealed space 9 is lead from the ventilation port 13 to the gas flow passage 23 and the refrigerant portion 3a, which deteriorates cooling performance inside the sealed space 9.

Since the cooling apparatus using boiling and condensing refrigerant as a whole is tilted toward the front of the box 8 so that the gas passing through the refrigerant portion 3a and the condensing portion 3b inside each heat transmission space 11 and 12 at the high and low temperature sides can smoothly flow from the respective ventilation ports 13 and 16 at the intake sides to the ventilation ports 14 and 17 at the outlet sides, the gas passing through the refrigerant portion 3a and the condensing portion 3b can have moderate change in the flowing direction, which contributes to the reduction of the loss of the gas flow passage in a narrow space. As a result, the fan 15 inside the sealed space 9 can be smaller and the amount of heat generated by the heat generating element 7 can be increased by the reduced amount of heat generated by the fan 15 (in other words, if the fan 15 becomes larger to increase cooling performance, the amount of heat generated by the fan 15 increases, so that the amount of heat generated by the heat generating element 7 cannot be consequently increased).

An eighth preferred embodiment according to the present invention is described below.

Figure 13:
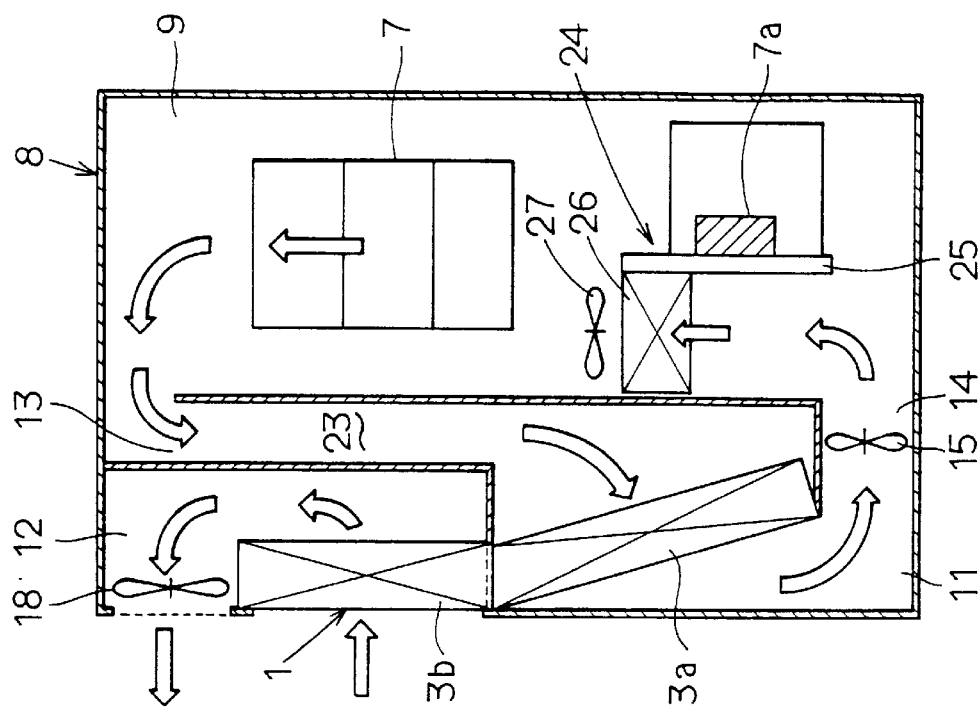
FIG. 13 is a schematic view showing an example where a cooling apparatus using boiling and condensing refrigerant is used according to an eighth embodiment of the present invention.

FIG. 13 is a schematic view showing an example where a sub-cooling apparatus using boiling and condensing refrigerant 24 is disposed inside the sealed space 9 to directly fix a heat generating element whose heat generating capability is especially large among the heat generating elements 7 disposed inside the sealed space 9 or one having a large heat generating capability (i.e., a high heat density) per surface area of the heat generating surface of the heat generating elements 7 to a refrigerant portion 25 of the sub-cooling apparatus using boiling and condensing refrigerant 24.

Figure 14:
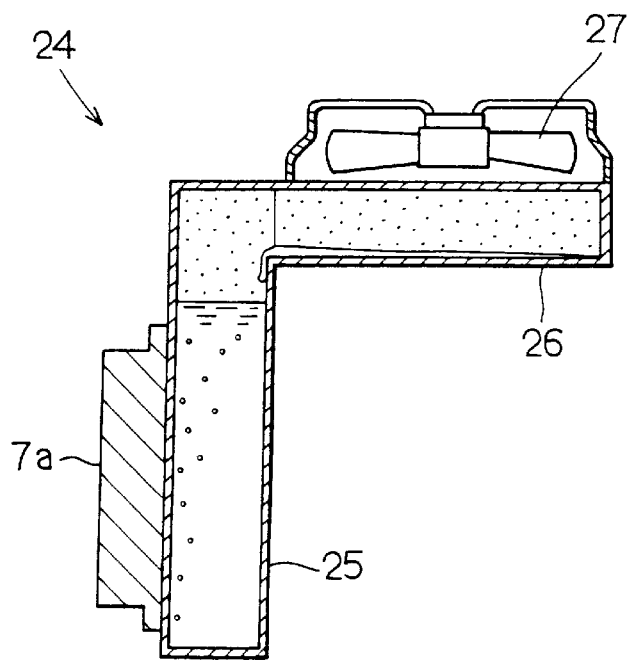
FIG. 14 is a cross-sectional side elevation view of a sub-cooling apparatus using boiling and condensing refrigerant according to the eighth embodiment.
Figure 15:
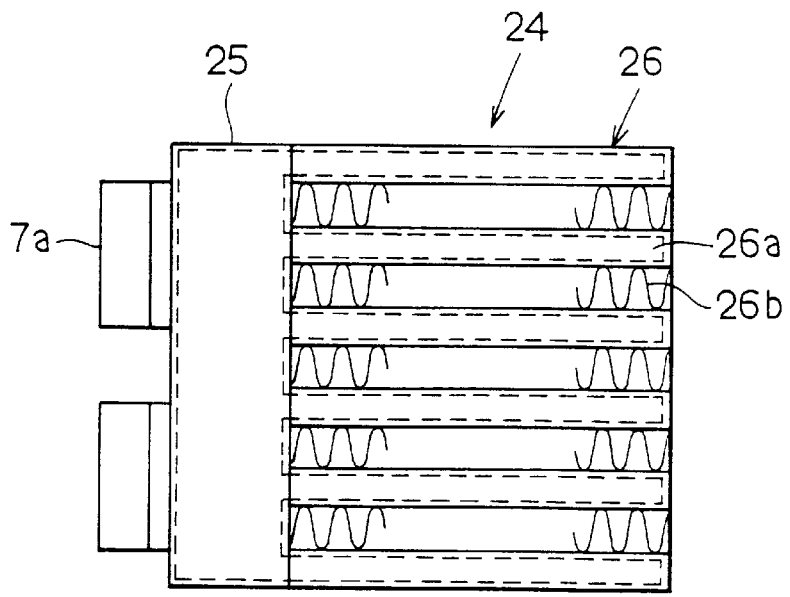
FIG. 15 is a view of the sub-cooling apparatus taken from below according to the eighth embodiment.

The sub-cooling apparatus using boiling and condensing refrigerant 24 has the refrigerant portion 25, a condensing portion 26 and a fan 27 as shown in FIGS. 14 and 15. A heat generating element 7a having high heat density is directly fixed to the refrigerant portion 25 with a bolt (not shown). Heat generated by the heat generating element 7a is transmitted to each heat radiating tube 26a of the condensing portion 26 by heat transmission in boiling and condensation of the refrigerant sealed in the refrigerant portion 25 and is released into the sealed space 9 via heat radiating fins 26b disposed between the heat radiating tubes 26a. Since the sub-cooling apparatus using boiling and condensing refrigerant 24 has an extremely high heat transmitting rate (i.e., low heat resistance) in boiling and condensation of the refrigerant, a sufficient heat radiating amount can be secured even if the difference between the temperature of the heat generating surface of the heat generating element 7a and the temperature inside the sealed space 9 is small compared with a forced convection cooling system.

If an element with high heat density is cooled by a forced convection system which has large heat resistance, the difference in temperature between the heat generating surface of the heat generating element 7a and the inside of the sealed space 9 has to be large, which means that the maximum temperature inside the sealed space 9 must be low. If this requirement is met by only the main cooling apparatus using boiling and condensing refrigerant, the heat radiating portion 3b has to be quite large. However, if the heat generating element 7a with high heat density is directly fixed to the refrigerant portion 25 of the sub cooling apparatus using boiling and condensing refrigerant 24 for cooling, the maximum temperature inside the sealing space 9 can be increased, so that even if there is the heat generating element 7a with a high heat density is inside the sealing space 9, the main cooling apparatus using boiling and condensing refrigerant can be relatively small. The fan 27 of the sub-cooling apparatus using boiling and condensing refrigerant 24 can be a fan with low output which can compensate for the increase of pressure loss of the heat radiating fin 26b disposed at the condensing portion 26. Since the condensing portion 26 of the sub-cooling apparatus using boiling and condensing refrigerant 24 is disposed in the gas flow passage inside the sealed space 9, the gas flow can be sent to the condensing portion 26 with the gas flow blowing capacity of the fan 15. Therefore the fan 27 of the sub-cooling apparatus using boiling and condensing refrigerant 24 can be omitted.

The whole body of the cooling apparatus using boiling and condensing refrigerant is tilted to make the gas passing through the refrigerant portion 3a and the condensing portion 3b flow smoothly in the aforementioned seventh embodiment; however, in the present embodiment, only the refrigerant portion 3a is disposed at a tilt to make the installation space (i.e., the space in the front and the rear direction) of the cooling apparatus using boiling and condensing refrigerant in the whole area of the box 8 smaller, i.e., thinner. The smaller the installation space occupied by the cooling apparatus using boiling and condensing refrigerant becomes, the more the gas flow passage at the side of the refrigerant portion 3a formed inside the sealed space 9 is restricted. Under such circumstances, because the gas flow passage at the side of the refrigerant portion 3a has a larger pressure loss than the wind passage route at the side of the condensing portion 3b formed outside the sealed space 9, at least the refrigerant portion 3a is tilted to reduce the loss of the gas flow passage at the side of the refrigerant portion 3a. The amount of heat generated by the fan 15 inside the sealed space 9 can be reduced by the reduction of the loss of the wind passage route. Accordingly, the amount of the heat generated by the heat generating element 7 can be increased, which provides the same advantages as in the seventh embodiment.

A ninth preferred embodiment of the present invention is described below.

Figure 16:
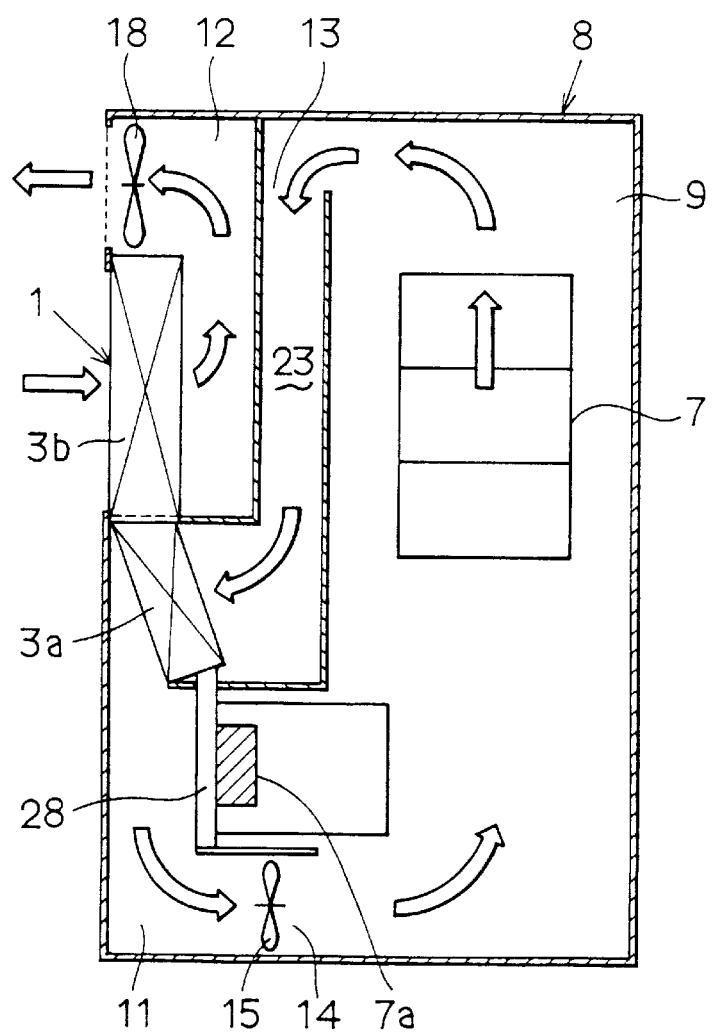
FIG. 16 is a schematic view showing an example where a cooling apparatus using boiling and condensing refrigerant is used according to a ninth embodiment according to the present invention.
Figure 19:
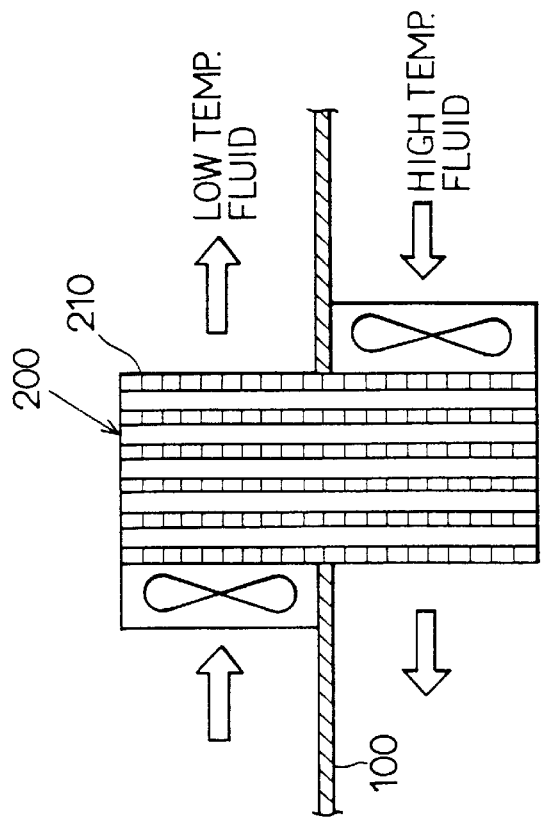
FIG. 19 is a schematic view showing an example where a heat pipe is used according to the prior art.

FIG. 16 is a schematic view of an example which has a sub-refrigerant portion 28 which is connected to the main refrigerant portion 3a and is fixed to the heat generating element 7a having a high heat density.

Similar to the eighth embodiment, the heat generating element 7a with high heat density can be directly cooled by heat transmission of boiling and condensation of the refrigerant sealed in the sub-refrigerant portion 28, and the heat can be radiated outside the sealed space 9 through the condensing portion 3b, so that a temperature difference between the heat generating element 7a and the inside of the sealed space 9 can be made larger without raising the temperature inside the sealed space 9. Therefore the cooling apparatus using boiling and condensing refrigerant as a whole can be made even smaller compared with the eighth embodiment.

In the present embodiment, the main refrigerant portion 3a and the sub-refrigerant portion 28 can be disposed as shown in FIG. 16. However, if the sub-refrigerant portion 28 is disposed above the main refrigerant portion 3a, the sub-refrigerant portion 28 has to be enlarged to enable the boiling refrigerant generated in the main refrigerant portion 3a to pass through the sub-refrigerant portion 28, which causes an increase in the amount of the sealed refrigerant and results in a cost increase. However, if the sub-refrigerant portion 28 is disposed below the main refrigerant portion 3a as shown in FIG. 16, the boiling refrigerant generated in the sub-refrigerant portion 28 passes through only the sub-refrigerant portion 28, which enables the whole cooling apparatus using boiling and condensing refrigerant to be made smaller and thinner, and the amount of sealed refrigerant can be also reduced compared with the case where the sub-refrigerant portion 28 is disposed above the main refrigerant portion 3a.

A tenth preferred embodiment of the present invention is described below.

Figure 17:
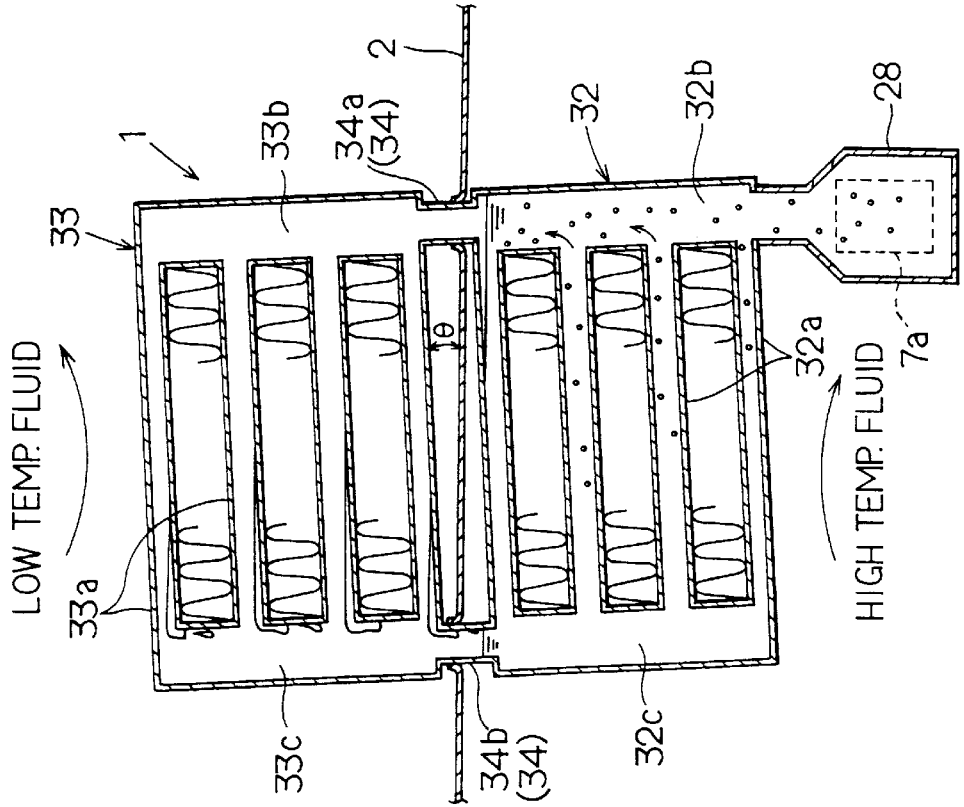
FIG. 17 is a cross-sectional view of a cooling apparatus using boiling and condensing refrigerant according to a tenth embodiment of the present invention.

FIG. 17 is a cross-sectional view of a cooling apparatus using boiling and condensing refrigerant which has a different structure from the one shown in the first embodiment having the cooling pipes 3. The present embodiment shows a refrigerant portion 32 disposed at the high temperature fluid side of the cooling apparatus using boiling and condensing refrigerant and a condensing portion 33 disposed at the low temperature fluid side thereof, and the refrigerant portion 32 and condensing portion 33 are connected in a ring shape via two connecting pipes 34 (34a and 34b).

The refrigerant portion 32 has plural refrigerant pipes 32a disposed in parallel with each other, and both ends of each refrigerant pipe 32a are connected to a set of refrigerant tanks 32b and 32c.

The condensing portion 33 has the same structure as the refrigerant portion 32 where plural condensing pipes 33a are disposed in parallel with each other and each end of each condensing pipe 33a is connected to a respective refrigerant tank 33b or 33c.

The two connecting pipes 34 are inserted into holes drilled through the fluid separator 2 and respectively connected to the refrigerant tanks 32b and 32c of refrigerant portion 32 at the high temperature fluid side of the cooling apparatus using boiling and condensing refrigerant and to the refrigerant tanks 33b and 33c of the condensing portion 33 at the low temperature fluid side thereof. Both connecting pipe 34 and the hole drilled through the fluid separator 2 are air-tightly connected and have no clearances which might prevent water from entering.

Similar to the ninth embodiment, the sub-refrigerant portion 28 having the heat generating element 7a (i.e., a heat generating element with high heat density) is connected to the refrigerant portion 32.

The whole cooling apparatus using boiling and condensing refrigerant tilts (at a tilting angle θ) with respect to the fluid separator 2, so that the refrigerant can be efficiently circulated between the refrigerant portion 32 and the condensing portion 33 via two connecting pipes 34a and 34b. The boiling refrigerant receiving heat from the high temperature fluid inside each refrigerant pipe 32a and the boiling refrigerant receiving heat from the heat generating element 7a inside the sub-refrigerant portion 28 rise due to buoyancy and can enter the condensing portion 33 through one connecting pipe 34a from the right refrigerant tank 32b in FIG. 17. On the other hand, the liquified refrigerant condensing on the inner wall of each condensing pipe 33a goes to the bottom of each condensing pipe 33a due to gravity and can return to the refrigerant portion 32 through the other connecting pipe 34b from the left refrigerant tank 33c in FIG. 17.

An eleventh preferred embodiment of the present invention is described below.

Figure 18:
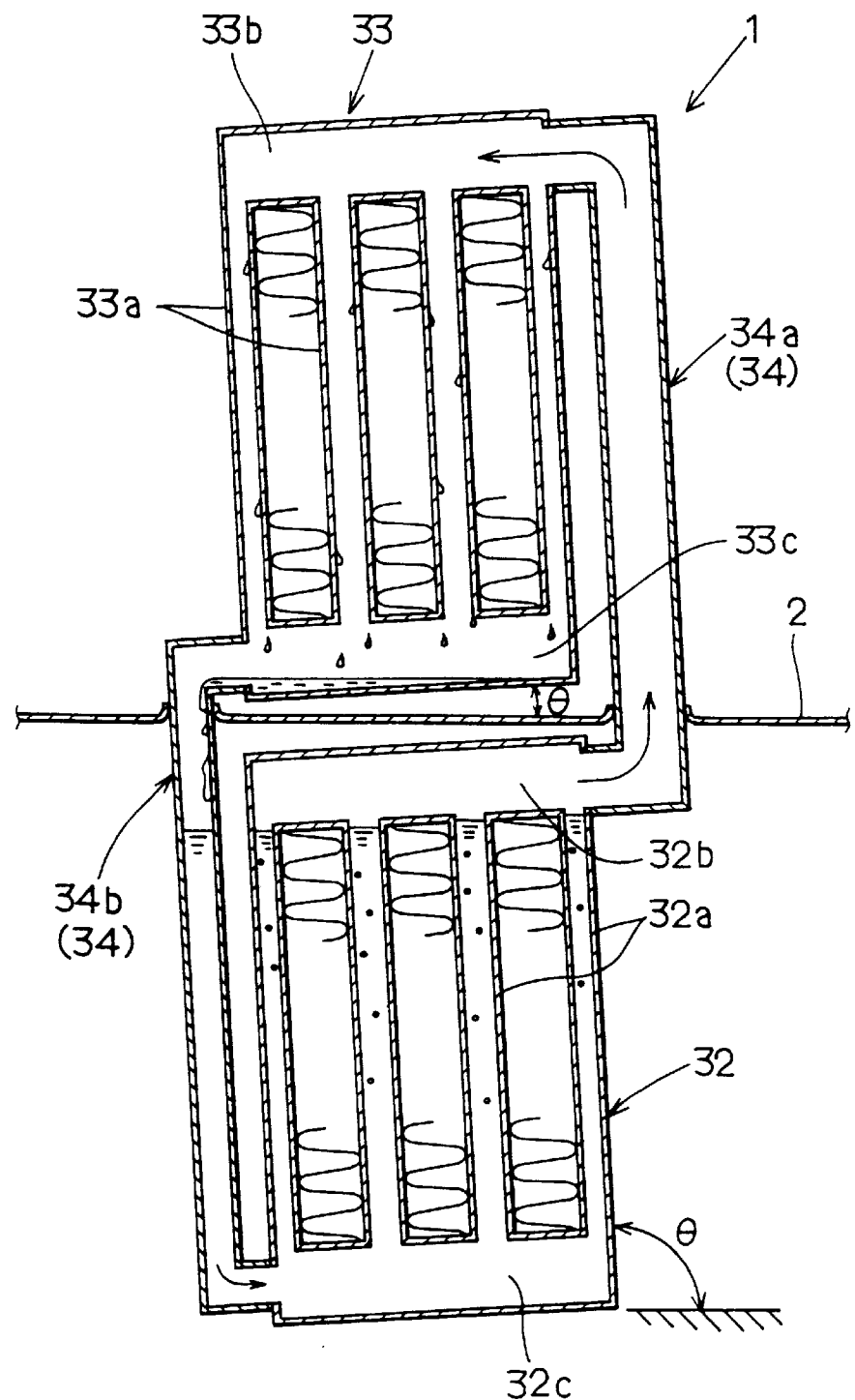
FIG. 18 is a cross-sectional view of a cooling apparatus using boiling and condensing refrigerant according to an eleventh embodiment of the present invention.

FIG. 18 is a cross-sectional view of a cooling apparatus using boiling and condensing refrigerant which has the refrigerant portion 32 and the condensing portion 33 which are connected in a ring shape with the two connecting pipes 34 (34a and 34b) similarly to the tenth embodiment. In the present embodiment as shown in FIG. 18, however, the refrigerant portion 32 and the condensing portion 33 tilt more by setting the tilting angle θ larger with respect to the fluid separator 2 to dispose each refrigerant pipe 32a and each condensing pipe 33a in a substantially vertical direction (i.e., the up-and-down direction in FIG. 18).

In this case, when, for example, θ=90°, the boiling refrigerant in the refrigerant portion 32 flows to the connecting pipe 34a from the upper refrigerant tank 32b after rising vertically inside each refrigerant pipe 32a. It further goes upward inside the connecting pipe 34a and is led to the condensing portion 33. In the condensing portion 33, the refrigerant is distributed to each condensing pipe 33a from the upper refrigerant tank 33b communicating with the connecting pipe 34a. The liquified refrigerant condensed on the inner wall of each condensing pipe 33a goes downward inside each condensing pipe 33a to flow from the lower refrigerant tank 33c to the other connecting pipe 34b. It further goes downward inside the other connecting pipe 34b to flow into the lower refrigerant tank 32c of the refrigerant portion 32. Thus, when the tilting angle θ of the refrigerant portion 32 and the condensing portion 33 with respect to the fluid separator 2 is enlarged, gravity can be effectively used with respect to the flow of the refrigerant. As a result, the amount of circulating refrigerant can be increased with improved cooling capacity. Because the volume of the refrigerant sharply decreases when it liquifies, the cross-sectional area of the passage of the other connecting pipe 34b can be designed smaller than that of the connecting pipe 34a.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A cooling apparatus for separating a high temperature fluid and a low temperature fluid using a fluid separator and transferring heat of said high temperature fluid to said low temperature fluid, said cooling apparatus comprising:

a refrigerant portion disposed at a high temperature fluid side of said apparatus, said refrigerant portion including a plurality of refrigerant pipes retaining refrigerant sealed therein which boils responsive to heat received from said high temperature fluid, thereby generating refrigerant vapor;

at least one connecting pipe for connecting said plurality of refrigerant pipes at a bottom portion thereof;

a sub-refrigerant portion, connected to one of said refrigerant pipe and said at least one connecting pipe and to a heat generating element, said sub-refrigerant portion being disposed under said at least one connecting pipe and said refrigerant pipe and having said refrigerant introduced therein; and a condensing portion, disposed at a low temperature fluid side of said apparatus, for releasing said heat of refrigerant vapor to said low temperature fluid to condense and liquefy said refrigerant vapor.

2. A cooling apparatus according to claim 1, said at least one connecting pipe comprising:

a first connecting pipe for sending refrigerant boiled in said plurality of refrigerant pipes of said refrigerant portion to a plurality of condensing pipes of said condensing portion; and a second connecting pipe for returning refrigerant condensed and liquefied in said plurality of condensing pipes in said condensing portion to said plurality of refrigerant pipes in said refrigerant portion;

wherein said sub-refrigerant portion is connected to one of said refrigerant pipe and said first connecting pipe under said first connecting pipe in said refrigerant portion.

3. A cooling apparatus according to claim 1, wherein a heat receiving fin and a heat radiating fin are connected to said refrigerant pipe of said refrigerant portion and a condensing pipe of said condensing portion, respectively, by brazed connections.

4. A cooling apparatus according to claim 2, wherein said refrigerant is sealed in said refrigerant portion and said first and second connecting pipe with a fluid level substantially equal to a height of said fluid separator.

5. A cooling apparatus according to claim 1, further comprising:

a box forming an airtight space with said fluid separator as a side wall;

wherein said refrigerant portion and said sub-refrigerant portion are disposed in said airtight space.

6. A cooling apparatus according to claim 5, wherein each wall of said box forming said air-tight space is made of at least one of a magnetic material and a conductor.

7. A cooling apparatus according to claim 1, wherein said refrigerant portion is tilted relative to a direction of gas flow to enlarge an effective area of said refrigerant portion presented to said gas flow.

* * * * *